SUPERCONDUCTIVE TUNNELING GATE

Filed Nov. 24, 1967

INVENTOR
WALTER R. BEAM

BY [signature]
ATTORNEY

United States Patent Office 3,521,133
Patented July 21, 1970

3,521,133

SUPERCONDUCTIVE TUNNELING GATE

Walter R. Beam, Chappaqua, N.Y., assignor to International Business Machines Corporation, Armonk, N.Y., a corporation of New York Filed Nov. 24, 1967, Ser. No. 685,700
Int. Cl. H03k 3/38
U.S. Cl. 317—234 7 Claims

ABSTRACT OF THE DISCLOSURE

A superconductive Josephson junction is provided which serves as a gate or logic element. A conventional Josephson junction consists of a gate made of a "sandwich" of a first superconductive metal, an oxide of the metal that forms a barrier region, and a second superconductive metal. One state of the Josephson junction consists of superconductive current flow through the junction accompanied by a voltage drop and a second state consists of superconductive current flow across the junction without producing a voltage drop across the junction. The change in state is produced by an external magnetic field that induces a current across the junction that exceeds the critical current of such junction. An improvement over such conventional Josephson junction is attained by making a joint Josephson junction, and applying an external magnetic field so that such field is parallel to the length of the joint junction instead of at right angles to it. Such geometry has resulted in achieving high gain for a Josephson junction tunneling gate.

BACKGROUND OF THE INVENTION

In the construction of superconductive Josephson tunneling devices in accordance with prior art teachings (see "The Tunneling Cryotron—A Superconductive Logic Element Based on Electron Tunneling"—J. Matisoo—Proc. of the IEEE, vol. 55, No. 2, February 1967, pp. 172–180), two thin metal films of superconductive material are separated by a thin barrier layer of the oxide of the metal, said barrier being of the order of 10–30 A., so as to form a junction "sandwich" of metal-metal oxide-metal. The junction is maintained at temperatures close to absolute zero, i.e., about 1°–6° K. In application, two such junctions may be placed in a parallel circuit, one in each path of such circuit, to provide a gating circuit or flip-flop. Current initially sent to the gating circuit divides equally into each path.

Each Josephson tunneling is capable of assuming two states of operation. One of these states is a pair tunneling state in which current can flow through the barrier region without any voltage drop. The other state is a single particle tunneling state in which current flows with a voltage across the junction. The transition from one state to the other is brought about by the coincidence of a gate and control current of appropriate magnitudes. In the quiescent state of the parallel circuit, each Josephson junction is in its pair tunneling state; gate current may be passed through the junction without a voltage appearing across the junction If a control conductor is located above a junction and is made to carry current, the magnetic field produced by such current-carrying control winding will induce a current across its associated junction so that the induced current, added to the gate current, will be sufficient to switch such junction to its single pair tunneling state so that a voltage appears across the junction. At such time, as voltage appears across the junction in a first leg, all gate current switches into the second leg of the parallel circuit that has no voltage across its junction and remains in that second leg even after the junction in the first leg returns to its nonvoltage state. This so-called "current-steering mode" is the normal mode of operation for superconducting switch devices.

The parallel circuit of the prior art noted above can be considered a binary flip-flop wherein nonvoltage current flow in one path is considered the storage of a "1" and similar current flow in the other path is considered as the storage of a "0." The application of a current pulse to the control winding adjacent a Josephson junction provides the steering step from one leg of the parallel circuit to the other leg. The ratio of the steered gate current ($I_g$) to the control current ($I_c$) required to cause the Josephson junction to undergo a transition to the single particle tunneling state is called the "gain" of the device. In order to perform logic with such devices as described hereinabove, $$\frac{I_g}{I_c}>1$$

To attain devices that have a gain of 3 or 4, a bias line as well as a control line is needed in prior art Josephson junctions for applying a magnetic field to the Josephson junction.

To avoid the need of employing a bias line to achieve gain for a Josephson tunneling junction, the latter is constructed in a novel manner. A superconductive ground plane is provided with an insulated surface, above which the novel Josephson tunneling junction is deposited. The latter comprises two adjacent noncontacting strips of superconductive material such as lead or tin. Niobium and tantalum are other superconductive metals that can be used with this invention. The strips are oxidized to produce a metal oxide approximately 10–30 A. thick. Over the adjacent oxidized superconductive strips are deposited the same superconductive material as was used to make the adjacent strips so as to completely bridge the gap between the strips, resulting in two Josephson junction in series.

An insulator is deposited over the entire assembly and a control line of superconducting material is deposited over the insulator near the bridge that connects the two strips. The control line is deposited so that it is disposed at right angles to the superconducting bridge that forms the dual junction. This control line, when carrying current, produces a magnetic field that is at right angles to the current being carried by the dual junction, and such feature allows for attaining lower threshold switching fields. Since the Josephson junction of this application has two oxide layer junctions instead of one, the voltage drop across the junction will be twice that of a single junction, allowing for faster switching of the junction from its nonvoltage-tunneling current state to its voltage-tunneling current state.

Thus it is an object of this invention to provide an improved superconductive tunneling junction having improved switching characteristics.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
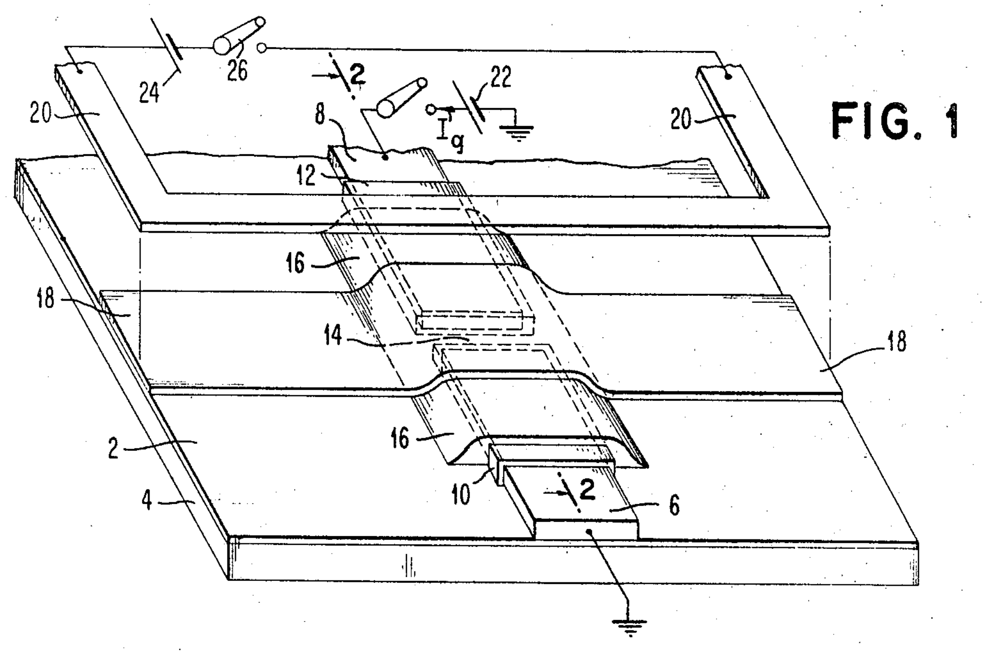
FIG. 1 is a showing of the novel dual junction tunneling device forming the present invention.

The improved Josephson junction shown in FIG. 1 is constructed by vapor deposition techniques well known in the art and described more fully in the above noted Matisoo publication. An insulated layer 2 of silicon monoxide or other suitable electrical insulation is deposited onto a superconductive ground plane 4, the latter being supported on a glass substrate, not shown. Atop the insulated surface 2 are deposited, through appropriate masks, two superconductive metal layers 6 and 8, each having a thickness of the order of 3000 A. These metal layers are oxidized so that two very thin oxidized layers 10 and 12 of the order of 30–60 A. are formed in the vicinity of gap 14 existing between film 6 and film 8. A bridge 16 of superconductive material, which is of the same metal as is employed to deposit strip 6 or 8, is deposited over the gap 14 so as to effectively construct two Josephson junctions, each composed of a sandwich of metal-metal oxide-metal.

To complete the structure of the device of FIG. 1, insulation layer 18 is deposited over the dual junction and a superconductive metal film 20 is deposited thereon, the deposition being such that the portion of film 20 that is above the dual junction is disposed at right angles to the direction of the dual junction and is a fraction of the width of either film 6 or 8. Ratios of 4:1 of film width 6 to film width 20 to provide adequate gain. If the dual junction in the vicinity of gap 14 is considered as part of a gate circuit capable of being switched from its nonvoltage current state to its voltage current state, then gate current $I_g$ is provided from any suitable source such as battery 22. To change the state of the joint junction in the vicinity of gap 14, a current source, indicated by battery 24, and switch 26 are employed to apply current to control winding 20.

Figure 2:
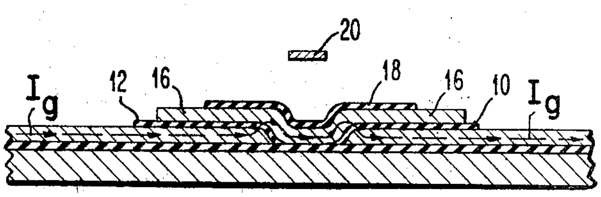
FIG. 2 is a cross section of the device of FIG. 1 taken along the line 2—2 of FIG. 1.
Figure 4:
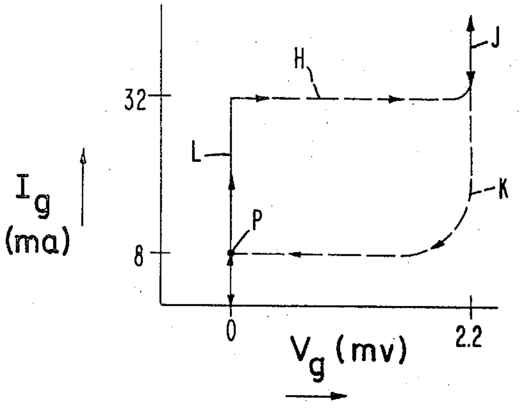
FIG. 4 is a typical plot of $I_g$ v. $V_g$ for the novel junction.

The overall operation of the gate of FIG. 1 will be described in conjunction with FIG. 4 which is an $I_g$–$V_g$ plot of the operating characteristics of the dual junction, and $I_g$ and $V_g$ are respectively the current and voltage through the junction. Assume that, for the parameters chosen to make the joint Josephson junction, the threshold current of the junction is 32 ma. So long as the gate current through the joint junction is less than 32 ma., current through both junctions will be the result of tunneling by Cooper pairs and will result in nonvoltage current as indicated by line L of the $I_g$–$V_g$ plot. When control current $I_c$ is sent through control strip 20, because the control winding is at right angles to the joint junction in the vicinity of gap 14, the magnetic field, created by the current $I_c$ in such control winding 20, will penetrate both junctions and induce a current therein in the direction of the arrows shown in FIG. 2. When the induced current, added to the gate current, exceeds the threshold current, i.e., about 32 ma., Cooper pair tunneling is replaced by single electron tunneling and tunneling current through the Josephson junction follows along line H, producing a voltage drop of approximately 2.2 mv. before the voltage drop across the metal oxide saturates.

A stable voltage state of the Josephson junction will be along line J when control current $I_c$ is removed. Should the tunneling current through both junctions go below threshold, the joint junction returns along path K to a nonvoltage current state, represented by point P.

Figure 3:
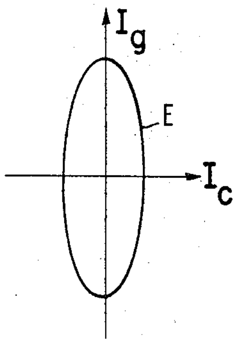
FIG. 3 is a plot of the gain curve for the device of FIG. 1.

FIG. 3 is a plot of the gain characteristics of the device of FIG. 1 wherein the ordinate is a plot of the gate current $I_g$ and the abscissa is a plot of the control current $I_c$. Since gain is the ratio $I_g/I_c$, it is seen that ratios $>1$ are readily attainable. In practice, by employing the configuration shown in FIG. 1, the gain is substantially equal to the ratio of the gate conductor width of films 6 and 8 and the control conductor width of film 20. Gain values of at least 3 or 4 are quite feasible.

In general, it has been found that the switching speed of the Josephson junction in going from the nonvoltage current state to the voltage current state is a function of the voltage drop across the junction. Since the configuration of FIG. 1 is effectively two junctions in series, twice the voltage drop of a single junction is produced, resulting in increasing switching speeds. All points within the ellipse E of FIG. 3 represent zero or nonvoltage states of the devices.

Figure 5:
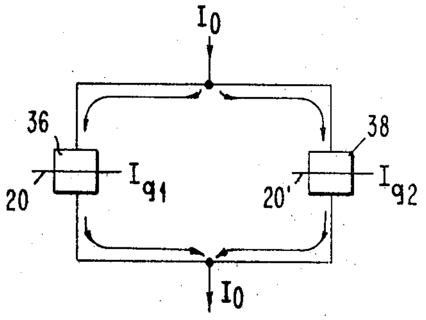
FIG. 5 is a showing of how the novel Josephson junction can be employed in a flap-flop circuit.

FIG. 5 represents a flip-flop circuit in which the novel Josephson junction can be utilized. Thirty-six (36) and 38 are schematic representations of two joint junctions made in the manner shown in FIG. 1. Initially, gate current $I_0$ will flow through the parallel circuit forming the flip-flop and will divide equally, $I_{g1}$ flowing in one leg and $I_{g2}$ flowing in the other leg, and $I_{g1}=I_{g2}$. If control current is sent through central winding 20 associated with Josephson junction 36 so as to exceed the latter's critical current, said junction will switch to its voltage current state and cause all of current $I_0$ to switch to the leg that contains joint junction 38. It is to be assumed that the total current $I_0$ is always less than the critical current of either junction 36 or 38.

A Josephson tunneling junction has been devised which produces higher voltage drops across itself during transition from its nonvoltage state to its voltage state than the single Josephson tunneling junction produces and gain is also achieved without the need of bias lines and the accompanying insulating layers.

Moreover, a control conductor at right angles to and over a single Josephson junction could not produce a magnetic field which would penetrate the superconductor into the oxide region to switch the junction at high gain. The double junction, on the other hand, obtains high gain switching by providing a short section of superconductor which does not need to be penetrated to allow a field from the gate conductor to appear in the oxide region. U.S. Pat. No. 3,281,609 to J. M. Rowell and the publication "Possible New Effects in Superconductive Tunneling" by B. D. Johnson that appeared in Physics Letters, July 1, 1962, vol. 1, No. 7, pp. 251–3, are of interest and will aid one in obtaining a historical background out of which the present invention arose.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A superconductive tunnel junction device comprising an insulated substrate having two coplanar adjacent superconductive metal films disposed thereon, a gap between said films, an oxidized layer on each of said films near the vicinity of said gap, a superconductive metal bridging said gap so as to form two adjacent junctions of metal, metal-oxide and metal, an insulated layer over said gap, and a third conductive film disposed on said insulated layer and located in the vicinity of said gap and at right angles to said coplanar metal films.

2. A superconductive tunnel junction as defined in claim 1 wherein said third film is narrower than either of said two coplanar metal films.

3. The device of claim 1 wherein said coplanar metal films and superconductive metal bridging said gap are made of lead.

4. The device of claim 1 wherein said coplanar metal films and superconductive metal bridging said gap are made of tin.

5. The device of claim 1 wherein said coplanar metal films and superconductive metal bridging said gap are made of tantalum.

6. The device of claim 1 wherein said coplanar metal films and superconductive metal bridging said gap are made of niobium.

7. A superconductive tunnel junction device comprising an insulated substrate having two coplanar superconductive metal films disposed thereon and separated by a gap, an oxidized layer of the order of 30–60 A. on each of said films near the vicinity of said gap, a superconductive metal bridging said gap so as to form two adjacent junctions of metal, metal-oxide and metal, and a third conductive film disposed above said bridged gap and insulated therefrom, said third film being substantially at right angles to said two coplanar films.

References Cited

UNITED STATES PATENTS

| | | | |
|---|---|---|---|
| 3,370,210 | 2/1968 | Fiske | 317—235 |
| 3,458,735 | 7/1969 | Fiske | 307—306 |
| 3,281,609 | 10/1966 | Rowell | 307—88.5 |

FOREIGN PATENTS

M. Merriam: I.B.M. Technical Disclosure Bulletin, vol. 7, No. 3, August 1964, p. 271.

JOHN HUCKERT, Primary Examiner

M. H. EDLOW, Assistant Examiner

U.S. Cl. X.R.

307—306